(12) United States Patent
Kim et al.

(10) Patent No.: US 7,791,338 B2
(45) Date of Patent: Sep. 7, 2010

(54) MRI METHOD OF DETERMINING TIME-OPTIMAL GRADIENT WAVEFORMS WITH GRADIENT AMPLITUDE AS A FUNCTION OF ARC-LENGTH IN K-SPACE

(75) Inventors: Seung Jean Kim, Palo Alto, CA (US); John M. Pauly, Stanford, CA (US); Michael Lustig, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 286 days.

(21) Appl. No.: 11/852,198

(22) Filed: Sep. 7, 2007

(65) Prior Publication Data

US 2009/0069664 A1 Mar. 12, 2009

(51) Int. Cl.
*G01V 3/00* (2006.01)
(52) U.S. Cl. ...................................................... 324/307
(58) Field of Classification Search ......... 324/300–322; 600/407–435
See application file for complete search history.

(56) References Cited

U.S. PATENT DOCUMENTS

| | | | |
|---|---|---|---|
| 6,020,739 A | 2/2000 | Meyer et al. | 324/309 |
| 6,198,282 B1 | 3/2001 | Dumoulin | 324/307 |
| 6,288,547 B1 * | 9/2001 | Heid | 324/322 |
| 6,566,877 B1 | 5/2003 | Anand et al. | 324/314 |
| 6,937,015 B2 * | 8/2005 | Heid | 324/307 |
| 7,301,341 B2 * | 11/2007 | Hargreaves et al. | 324/307 |
| 2003/0191386 A1 * | 10/2003 | Heid | 600/410 |
| 2005/0077895 A1 * | 4/2005 | Hargreaves et al. | 324/309 |
| 2009/0069664 A1 * | 3/2009 | Kim et al. | 600/410 |

OTHER PUBLICATIONS

Hargreaves et al., "Time-optimal multi-dimensional gradient waveform design for rapid imaging," Magn Reson Med, vol. 51, No. 1, pp. 81-92, 2004.
Kim et al., "A comparison principle for state-constrained differential inequalities and its application to time-optimal control", IEEE Transactions on Automatic Control, vol. 50, No. 7, pp. 967-983, 2005.
Lustig et al., "A Fast Method for Designing Time-Optimal Gradient Waveforms for Arbitrary k-Space Trajectories", Submitted to IEEE TMI, 9 pages, 2006, revised Oct. 2007.
Oliver Heid, "Contemporary MRI design and Challenges", Presentation given by author at IEEE EMBS Boston Chapter Meeting, Jun. 28, 62 pages, 2006.

* cited by examiner

*Primary Examiner*—Brij B. Shrivastav
*Assistant Examiner*—Tiffany A Fetzner
(74) *Attorney, Agent, or Firm*—Beyer Law Group LLP

(57) ABSTRACT

A method for magnetic resonance imaging (MRI) is provided. A scanning path is specified. Gradient amplitude is determined as a function of arc-length along the scanning path in k-space. A time optimal gradient waveform for scanning the scanning path is calculated from the gradient amplitude. The scanning path is scanned using the time optimal gradient waveform.

19 Claims, 8 Drawing Sheets

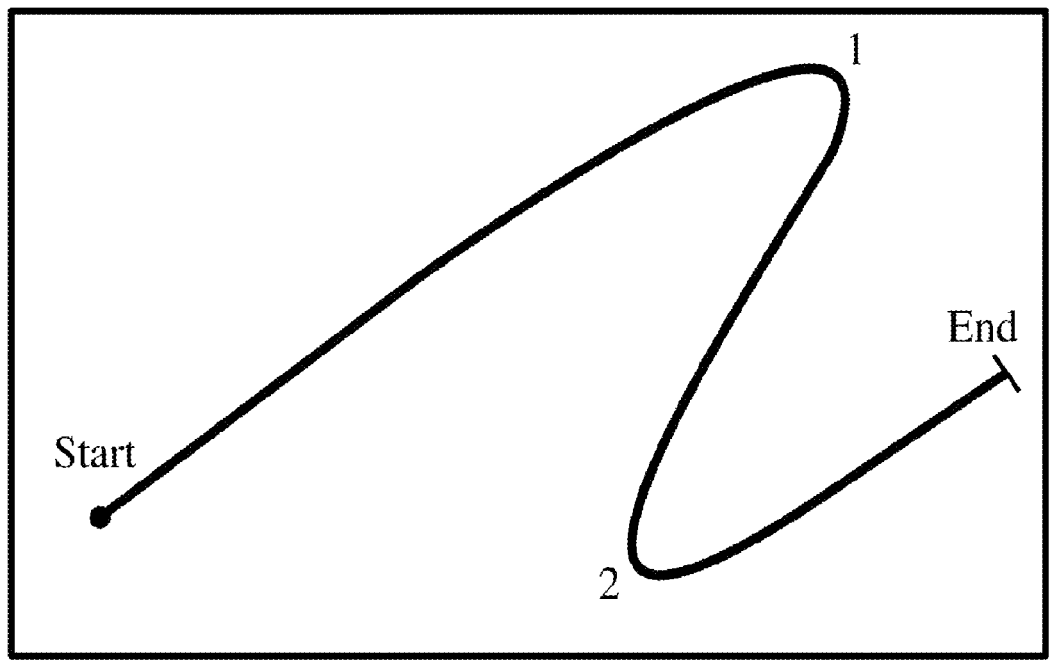
(a)
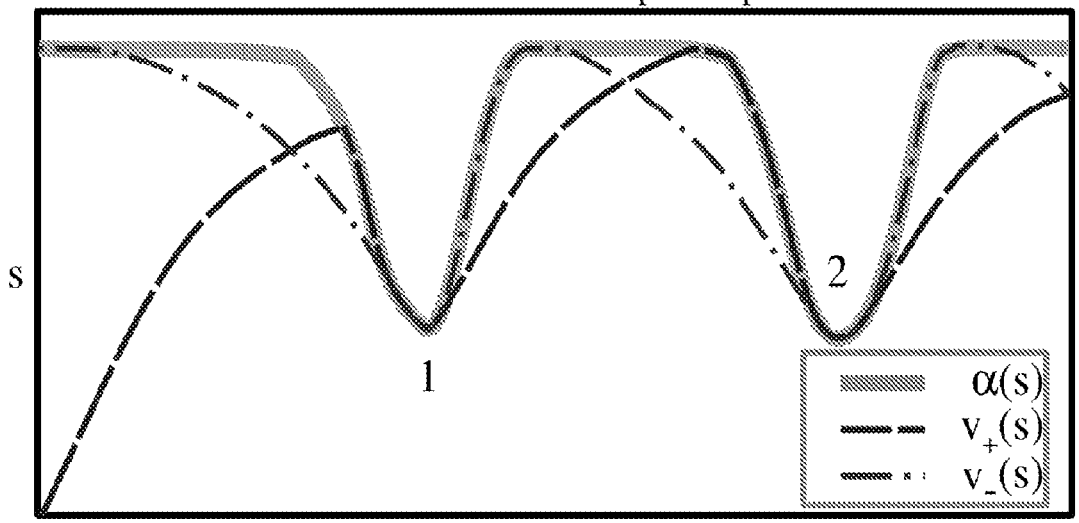
(b)
FIG. 2

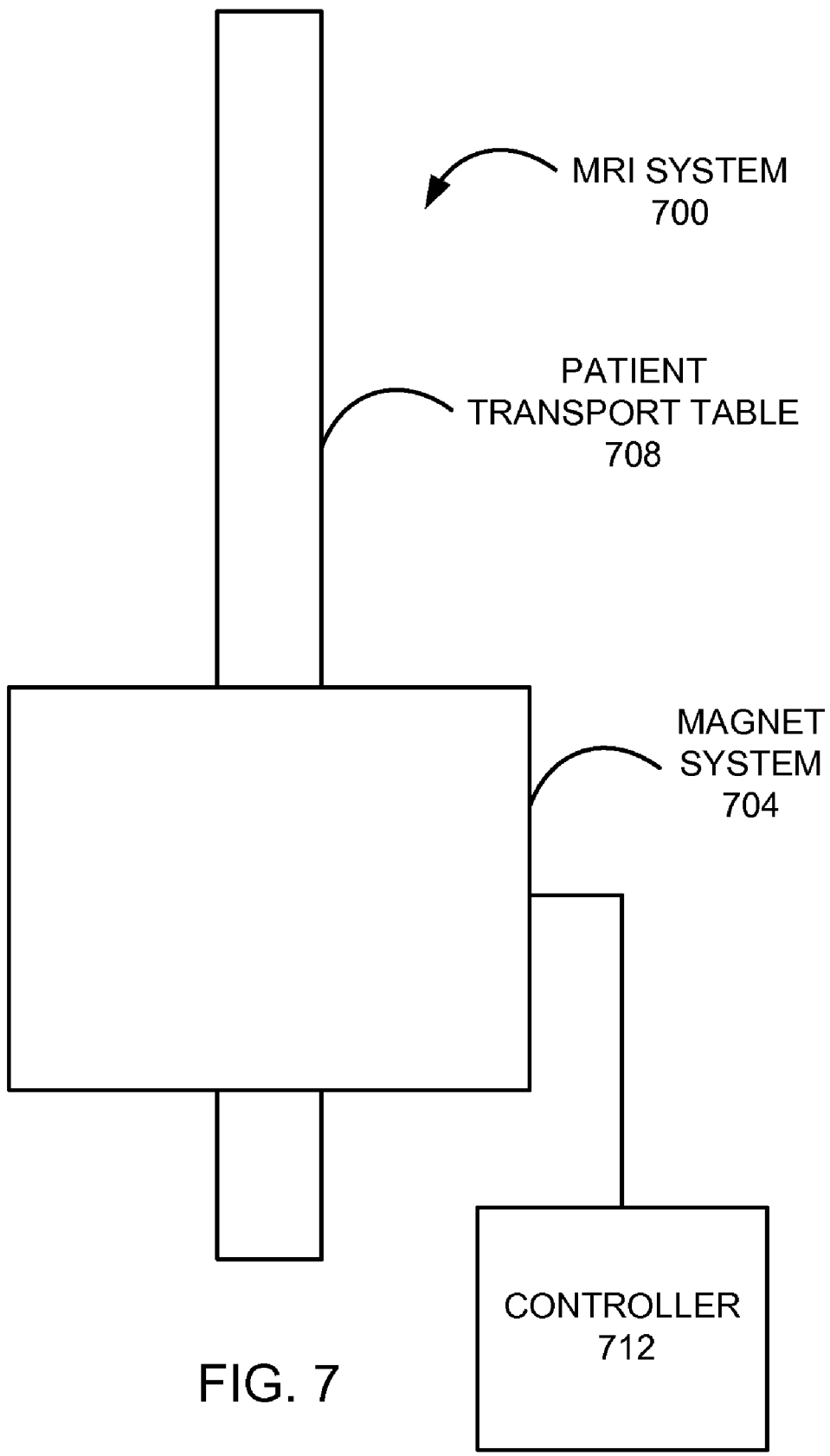

MRI METHOD OF DETERMINING TIME-OPTIMAL GRADIENT WAVEFORMS WITH GRADIENT AMPLITUDE AS A FUNCTION OF ARC-LENGTH IN K-SPACE

STATEMENT REGARDING FEDERALLY SPONSORED RESEARCH OR DEVELOPMENT

The U.S. Government has rights in the disclosed invention pursuant to NIH Grant Numbers R01 HL074332, R01 EB002992, R01 HL067161 to Stanford University.

BACKGROUND OF THE INVENTION

This invention relates generally to magnetic resonance imaging (MRI), and more particularly the invention relates to mapping the magnitude of RF fields in a MRI pulse sequence.

Magnetic resonance imaging (MRI) requires placing an object to be imaged in a static magnetic field ($B_0$), exciting nuclear spins in the object with a RF magnetic field ($B_1$), and then detecting signals emitted by the excited spins as they process within the magnetic field ($B_0$). Through the use of magnetic gradient and phase encoding of the excited magnetization, detected signals can be spatially localized in three dimensions.

SUMMARY

In accordance with the invention, a method for magnetic resonance imaging (MRI) is provided. A scanning path is specified. Gradient amplitude is determined as a function of arc-length along the scanning path in k-space. A time optimal gradient waveform for scanning the scanning path is calculated from the gradient amplitude. The scanning path is scanned using the time optimal gradient waveform.

In another manifestation of the invention a magnetic resonance imaging apparatus is provided. A magnetic resonance imaging excitation and detection system is provided. A controller electrically is connected to the magnetic resonance imaging excitation and detection system and comprises a display, at least one processor, and computer readable media. The computer readable media comprises computer readable code for specifying a scanning path, computer readable code for determining gradient amplitude as a function of arc-length along the scanning path in k-space, computer readable code for calculating a time optimal gradient waveform for scanning the scanning path from the gradient amplitude, and computer readable code for scanning along the scanning path using the time optimal gradient waveform.

The invention and objects and features thereof will be more readily apparent from the following detailed description and appended claims when taken with the drawings.

BRIEF DESCRIPTION OF THE DRAWINGS

FIGS. 2a-b illustrate a path and the solutions in the phase-plane.

FIG. 7 is a schematic top view of a magnetic resonance imaging (MRI) system.

DETAILED DESCRIPTION OF ILLUSTRATIVE EMBODIMENTS

Figure 1:
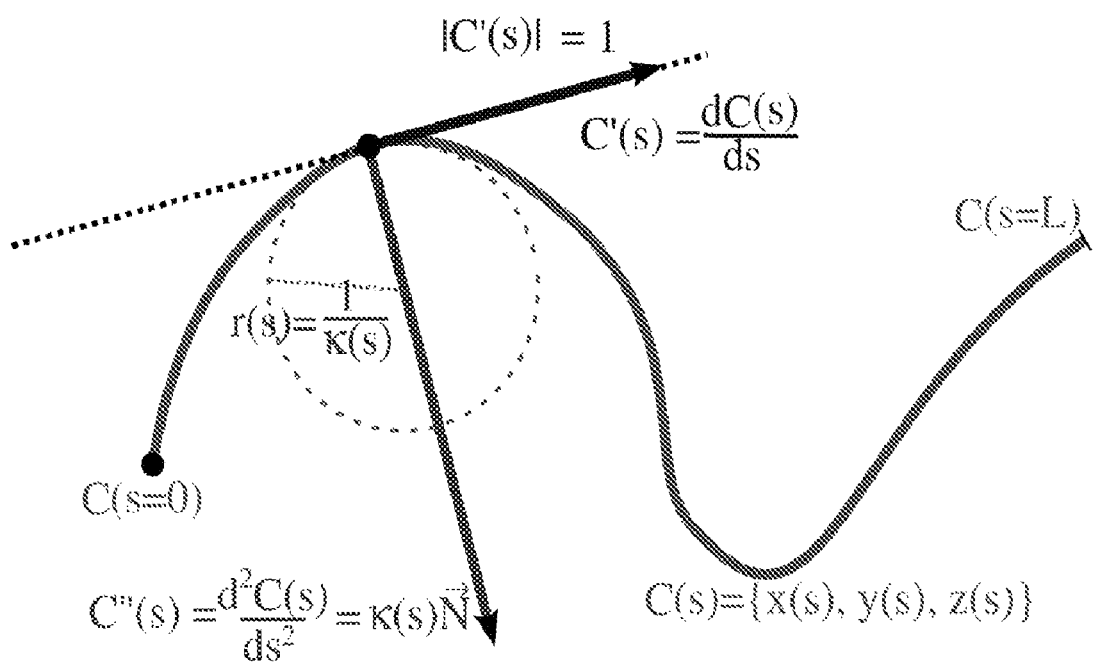
FIG. 1 is an illustration of a specified path, curve, or trajectory C from C(0) to C(L) in k-space.

MRI imaging may be performed by scanning in k-space. The scanning may done along trajectories that allow a trivial solution to obtain the fastest scanning time. For example, such a k-space scanning may be along parallel lines. More complicated scanning trajectories would require nontrivial solutions.

The design of time-optimal gradient waveforms is an important problem in rapid imaging. Several design methods have been previously proposed for some specific trajectories, but not for the general case. An embodiment of the invention provides a complete simple and efficient method to design time-optimal gradient waveforms for arbitrary multi-dimensional k-space trajectories. The key in this method is to design a gradient amplitude as a function of arc-length along the k-space trajectory, rather than as a function of time. This approach can be used to design simple as well as complicated waveforms. The algorithm is fast and may be used even in real-time applications where an optimized waveform is designed on the fly in real time for each scan plane. Some examples of applications are arbitrary, random and non-freely rotatable trajectories.

Advances in the field of Magnetic Resonance Imaging (MRI) such as gradient hardware, high field systems, optimized receiver coil arrays, fast sequences and sophisticated reconstruction methods provide the ability to image faster than ever. Acquisition methods are being explored in which k-space is scanned in non-traditional trajectories.

One of the design challenges in rapid imaging is to minimize the gradient waveform duration, subject to both hardware and sequence constraints. Numerous works have presented different methods for optimizing the gradient waveform for various situations.

An example of the invention provides a time-optimal gradient waveform for arbitrary k-space trajectories. A time-optimal gradient waveform for arbitrary k-space trajectories provides the gradient waveform that will traverse k-space from one point to another along a specific path in the minimum time for a specified arbitrary trajectory. For some trajectories, such as linear, circular or spirals the solution is trivial. However the solution for the general case is non-trivial.

This example of the invention provides a fast and simple algorithm based on optimal control theory that provides the complete solution to the time-optimal gradient waveform for any arbitrary k-space path. The power of this method is demonstrated by designing a gradient waveform for an arbitrary trajectory for which the solution is non-trivial. Furthermore, other possible applications such as designing a non-freely rotatable waveform is shown in which the waveform length is reduced by at least 5% compared to a freely rotatable one, and a randomly perturbed spiral trajectory which may be used for compressed sensing.

Since the algorithm is fast, this approach can be used to design simple as well as complicated waveforms on-the-fly and may even be used in real-time applications where, for each scan plane, optimized waveforms are designed on-the-fly in real time.

This example of the invention uses a parameterization of a point along the length of the trajectory path, instead of a point as a function of time. The velocity (gradient) is then determined for each point along the trajectory. The velocity is then used to obtain the point as a function of time.

Curve Parameterization

Below are some properties of planar and volumetric curves that are essential to the derivation of the time-optimal gradient waveform design.

Suppose a specified path, curve, or trajectory C from C(0) to C(L) in k-space is given, as illustrated in FIG. 1. Suppose the curve C is described as a function of some parameter p:

$$C(p)=(x(p),y(p),z(p)) \in R^3, p \in [0,p_{max}] \quad (1)$$

Here, p=0 corresponds to the initial point and p=$p_{max}$ corresponds to the end point:

$$C(0)=C_0, C(p_{max})=C_1. $$

The first derivative of the curve with respect to its parameterization is the velocity or tangent vector of the parameterization, which is denoted as $$T(p) = \frac{dC(p)}{dp} = C'(p). \quad (2)$$

The second derivative of the curve with respect to its parameterization is the acceleration vector of the parameterization $$A(p) = \frac{d^2 C(p)}{dp^2} = C''(p). \quad (3)$$

From here onwards h'(p) is denoted as the derivative of the function h with respect to a general parameter p. An exception is made when using the notation ḣ to specifically indicate that it is a time derivative.

A very useful parameterization is the Euclidean arc-length s parameterization:

$$C(s)=(x(s),y(s),z(s)), s \in [0,L] \quad (4)$$

where L is the length of the path. This parameterization describes the coordinates as a function of the Euclidean distance along the curve. An important property of this parameterization is that it has constant velocity, i.e., $$|C'(s)|=1 \quad (5)$$

for all s. Another important property is that the magnitude of the acceleration is the curvature k(s) of the curve, i.e.

$$|C''(s)|=k(s). \quad (6)$$

The curvature of the curve at a given point is the reciprocal of the radius of an osculating circle that has the same first and second derivatives with the curve at that point. FIG. 1 illustrates the properties of the arc-length parameterization.

When a curve is given in an arbitrary parameterization C(p)=(x(p),y(p),z(p)), it is always possible to convert into the arc-length parameterization by using the relation $$s(p) = \int_0^p |C'(q)| dq. \quad (7)$$

The Time-Optimal Gradient Waveform Design Problem

A gradient waveform is designed as a function of time. This is equivalent to designing a time parameterization of the curve that describes the k-space coordinates as a function of time. Specifically, a time function p=s(t) in the arc length parameterization is designed such that $$s(0)=0, s(T)=L$$

where T is the traversal time. The time trajectory in k-space is given by the composite function C̃(t)=C(s(t)).

First, the relation between the gradient waveform and the curve parameterization is derived. The gradient waveform is proportional to the velocity in the time parameterization and is given by $$g(t) = \gamma^{-1} \frac{dC(s(t))}{dt} = \gamma^{-1} C'(s(t)) \dot{s}(t) \quad (8)$$

where γ is the gyro-magnetic ratio. Recall the use of ṡ(t) to indicate a time derivative. The gradient slew-rate is proportional to the acceleration in the time parameterization. Using the chain rule obtains $$\dot{g}(t) = \gamma^{-1}(C''(s(t))\dot{s}(t)^2 + C'(s(t))\ddot{s}(t)). \quad (9)$$

The design variable in the MRI system is the gradient waveform. The gradients are subject to hardware as well as sequence constraints. For the hardware constraints the often used slew-limited model as described in B. A. Hargreaves, D. G. Nishimura, and S. M. Conolly, "Time-optimal multi-dimensional gradient waveform design for rapid imaging," Magn Reson Med, vol. 51, no. 1, pp. 81-92, 2004 (which is incorporated by reference) is assumed. In this model, the gradient amplitude is subject to the maximum amplitude of the system $$|g(t)| \leq G_{max}, t \in [0,T] \quad (10)$$

It is also subject to the maximum slew-rate of the system $$|\dot{g}(t)| \leq S_{max}, t \in [0,T] \quad (11)$$

For the sequence constraints, the gradient waveform is constrained to follow a specific trajectory in k-space such that $$\tilde{C}(t) = C_0 + \gamma \int_0^t g(\tau) d\tau$$

It is also constrained to have an initial value. For simplicity, an initial value of $$g(0)=0 \text{ is assumed.}$$

Other optional sequence constraints such as final or intermediate values are possible, but are not assumed here. Some of these optional constraints are discussed below.

Now that the hardware as well as the sequence constraints have been derived, the problem of finding the time-optimal gradient waveform that satisfies them is considered. The time-optimal problem can be formulated as $$\text{minimize } T \quad (12)$$

$$\text{subject to } |g(t)| \le G_{max}|, t \in [0, T]$$

$$|\dot{g}(t)| \le S_{max}, t \in [0, T]$$

$$g(0) = 0$$

$$\tilde{C}(t) = C_0 + \gamma \int_0^t g(\tau) d\tau, t \in [0, T]$$

$$\tilde{C}(0) = C_0$$

$$\tilde{C}(T) = C_1$$

Here the variable is the gradient g(t) defined over the time interval [0, T]. The objective is to minimize the traversal time T along the trajectory.

The time-optimal solution is always either gradient or slew-rate limited. Solving for the time-optimal waveform in this formulation requires finding the optimal switching times between the maximum gradient and maximum slew-rate. This procedure is difficult for complex curves. Instead, an alternative equivalent formulation is used in which the solution becomes simpler.

Formulation in the Arc-Length Parameterization

Let s denote the arc length from the initial point. Because the k-space path is given as a constraint, only designing the time function s(t) is needed. Note that s is always increasing, so $$\dot{s}(t) \ge 0.$$

It follows from (5) and (8) that $$|g(t)| = \gamma^{-1} \dot{s}(t). \quad (13)$$

This means that it is sufficient to design the gradient magnitude along the path.

The hardware constraints are formulated in the arc-length parameterization. It follows from equations (8), (9), (10), and (11) that $$\dot{s}(t) \le \alpha(s(t)) \quad (14)$$

$$|\ddot{s}(t)| \le \beta(s(t), \dot{s}(t)) \quad (15)$$

where $$\alpha(s) = \min\left\{\gamma G_{max}, \sqrt{\frac{\gamma S_{max}}{k(s)}}\right\}$$

$$\beta(s, \dot{s}) = [\gamma^2 S_{max}^2 - k(s)\dot{s}^4]^{1/2}.$$

A complete derivation of (14) and (15) is as follows:
It is observed that $$|\dot{g}(t)|^2 = |\gamma^{-1}(C''(s(t))\dot{s}(t)^2 + C'(s(t))\ddot{s}(t))|^2$$

$$= \gamma^{-2}(|C''(s(t))|^2 \dot{s}(t)^4 + |C'(s(t))|^2 \ddot{s}(t)^2 +$$

$$C''(s(t))^T C'(s(t))\dot{s}(t)^2 \ddot{s}(t)).$$

The tangent and the normal vectors are always orthogonal, that is, $C''(s(t))^T C'(s(t)) = 0$. Also, recall that $|C'(s(t))| = 1$ and that $|C''(s(t))| = k(s(t))$. The slew-rate constraint can therefore be expressed as $$\gamma^{-2}(k(s(t))^2 \dot{s}(t)^4 + \ddot{s}(t)^2) \le S_{max}^2$$

which in turn implies that $$\ddot{s}(t)^2 \le [\gamma^2 S_{max}^2 - k(s(t))^2 \dot{s}(t)^4].$$

The right-hand side is non-negative when $$\dot{s}(t) \le \sqrt{\frac{\gamma S_{max}}{k(s(t))}}.$$

Finally, the gradient magnitude is limited $|g(t)| \le G_{max}$ resulting in the desired second constraint, $$\dot{s}(t) \le \min\left\{\gamma G_{max}, \sqrt{\frac{\gamma S_{max}}{k(s(t))}}\right\}.$$

Intuitively, the constraint in (14) accounts for the geometry of the trajectory, and is related to the maximum velocity at which a curve can be approached without violating the acceleration constraint, and is independent of past or future velocities. Equation (15) is a dynamic constraint: It is a differential inequality that describes the allowed change in the velocity at a specific point on the path given the velocities in its proximity.

Finally, problem (12) can be equivalently formulated in the arc-length parameterization as $$\text{minimize } T$$

$$\text{subject to } \dot{s}(t) \le \alpha(s(t)), t \in [0, T]$$

$$|\ddot{s}(t)| \le \beta(s(t), \dot{s}(t)), t \in [0, T]$$

$$s(0) = 0, \dot{s}(0) = 0$$

$$s(t) = L \quad (16)$$

Here the variable is the time function s(t). Once the optimal solution s*(t) of problem (16) is known, the solution to the original problem (12) can be found using $$g^*(t) = \gamma^{-1} C'(s^*(t)) \dot{s}^*(t).$$

The Time-Optimal Solution in the Phase-Plane

Up until now, this example of the invention has provided only the formulation of the problem. In this part of the example of the invention a complete solution to (16) is provided. The solution is obtained in the velocity vs. arc-length plane (ṡ vs. s). This plane is often referred to as the phase-plane in optimal-control theory literature. The outline is the following: The optimal velocity is first found as a function of arc-length (v*(s)) and then the optimal time function s*(t) is found, which can be used to derive the optimal gradient waveform.

In the phase-plane, the velocity is represented as a function of arc length $$\dot{s}(t) = v(s(t)) \quad (17)$$

Note that the traversal time T is a function of the velocity given by $$T = \int dt = \int \frac{dt}{ds} ds = \int_0^L \frac{1}{\dot{s}} ds = \int_0^L \frac{1}{v(s)} ds.$$

Also, note that the acceleration is also a function of the velocity given by $$\ddot{s} = \frac{d\dot{s}}{ds}\frac{ds}{dt} = \frac{d\dot{s}}{ds}\dot{s} = v'(s)v(s).$$

Then, the time-optimal control problem (16) amounts to solving the following optimization problem in the phase-plane:

$$\text{minimize} \int_0^L \frac{1}{v(s)} ds \quad (18)$$

$$\text{subject to } v(s) \leq \alpha(s),\ s \in [0, L]$$

$$|v'(s)| \leq \frac{1}{v(s)}\beta(s, v(s)),\ s \in [0, L]$$

$$v(0) = 0$$

where the optimization variable is the function v(s) defined over [0,L].

The optimal solution v* to this problem describes the relation between the optimal time function s* and its derivative in the phase plane:

$$\dot{s}=v^*(s)$$

Using this relation, s* can be readily recovered from v*.

A complete solution to the optimization problem (18) will now be described. In order to find the optimal velocity, two ordinary differential equations (ODEs). The first ODE is given by $$\frac{dv_+(s)}{ds} = \begin{cases} \frac{1}{v_+(s)}\beta(s, v_+(s)) & \text{if } v_+(s) < \alpha(s) \text{ otherwise} \\ \alpha(s) & \end{cases} \quad (19)$$

need to be integrated, which are integrated forward with the initial condition v+(0)=0. The second ODE is $$\frac{dv_-(s)}{ds} = \begin{cases} -\frac{1}{v_-(s)}\beta(s, v_-(s)) & \text{if } v_-(s) < \alpha(s) \text{ otherwise} \\ \alpha(s) & \end{cases} \quad (20)$$

which is integrated backwards with the final condition $v_-(L)=v_+(L)$. (Recall that $\alpha(s)$ and $\beta(s, \dot{s})$ are given in (15).) FIGS. 2a-b illustrate a path and the solutions of (19) and (20) in the phase-plane. The $\alpha(s)$ curve dips correspond to large curvature in the curve. The curves $v_+(s)$ and $v_-(s)$ are the solution for forward and backwards propagation of the ODE. The optimal solution is the minimum of the curves.

The optimal velocity v*(s) is simply given by $$v^*(s)=\min\{v_+(s),v_-(s)\} \quad (21)$$

and is derived as follows:

Let v denote any velocity along the trajectory that satisfies the constraints of (18). It follows from Lemma 3 in S.-J. Kim, D. Choi, and I. Ha, "A comparison principle for state-constrained differential inequalities and its application to time-optimal control," IEEE Transactions on Automatic Control, vol. 50, no. 7, pp. 967-983, 2005 (which is incorporated by reference) that $$v(s) \leq \min\{v_+(s),v_-(s)\}=v^*(s),\ \forall s \in [0,L].$$

The traversal time T of v is given by $$T_v = \int_0^L \frac{ds}{v(s)},$$

and hence $$T_v \geq T_{v^*}.$$

It can be shown through some arguments similar to those used to prove Theorem 3 in the above reference that v* satisfies the constraints of (18). Therefore, v(s) is optimal if and only if $$v(s)=v^*(s).$$

The Time-Optimal Gradient Waveform Solution

The following describes the procedure to recover the time-optimal gradient waveform g*(t) from the optimal velocity v*(s). s*(t) can be obtained by computing the inverse function of t*(s), using the relation $$t^*(s) = \int_0^s \frac{ds'}{v^*(s')}.$$

In particular, the traversal time, which is the optimal value of (16), is given by $$T^* = \int_0^L \frac{ds}{v^*(s)}.$$

It follows from (8) that the time-optimal gradient waveform is $$g^*(t) = \gamma^{-1}\frac{dC(s^*(t))}{dt}. \quad (22)$$

An algorithm used in an example of the invention is as follows:

Given a curve in an arbitrary parameterization $\hat{C}(p)=\{x(p), y(p), z(p)\}$.

$$\text{Compute } s(p) = \int_0^p \left|\frac{d\hat{C}(p')}{dp'}\right| dp'$$

Compute $C(s)=\hat{C}(p(s))$ using the inverse of s(p).
Compute $\kappa(s)=|C''(s)|$.

$$\text{Compute } \alpha(S) = \min\left\{\gamma G_{max}, \sqrt{\frac{\gamma S_{max}}{\kappa(s)}}\right\}$$

Define: $\beta(s,\dot{s}) \equiv [\gamma^2 S_{max}^2 - \kappa^2(s)\dot{s}^4]^{1/2}$.
Integrate the ODE $$\frac{dv_+(s)}{ds} = \begin{cases} \frac{1}{v_+(s)}\beta(s, v_+(s)) & \text{if } v_+(s) < \alpha(s) \text{ otherwise,} \\ \alpha(s) \end{cases}$$

forward with the initial condition $v_+(0)=0$.
Integrate the ODE $$\frac{dv_-(s)}{ds} = \begin{cases} -\frac{1}{v_-(s)}\beta(s, v_-(s)) & \text{if } v_-(s) < \alpha(s) \text{ otherwise,} \\ \alpha(s) \end{cases}$$

backwards with the final condition $v_-(L)=v_+(L)$.
Let $v^*(s) = \min\{v_+(s), v_-(s)\}$.
Compute $s^*(t)$ using the inverse of $$t^*(s) = \int_0^s \frac{ds'}{v^*(s')}.$$

Compute $\tilde{C}(t) = C(s^*(t))$.

Compute $g^*(t) = \gamma^{-1}\frac{d\tilde{C}(t)}{dt}$.

Examples

In this section, a few examples are presented demonstrating some of the applications of the inventive method to gradient waveform design.

All simulations were performed using MathWorks' Matlab. Derivative operations were approximated by finite differences. Numerical integrations were approximated by the trapezoid method. The ODEs were solved using a 4th order Runge-Kutte method. Cubic-spline interpolation was used for interpolating the curve when needed. In these examples of designs, gradients capable of 40 mT/m, slew-rate of 150 mT/m/s and a sampling bandwidth of 250 KHz were assumed.

An Arbitrary Trajectory

To test an example of a design algorithm, the design algorithm was applied to a k-space trajectory that was chosen to have a non-trivial time-optimal solution.

Figure 3:
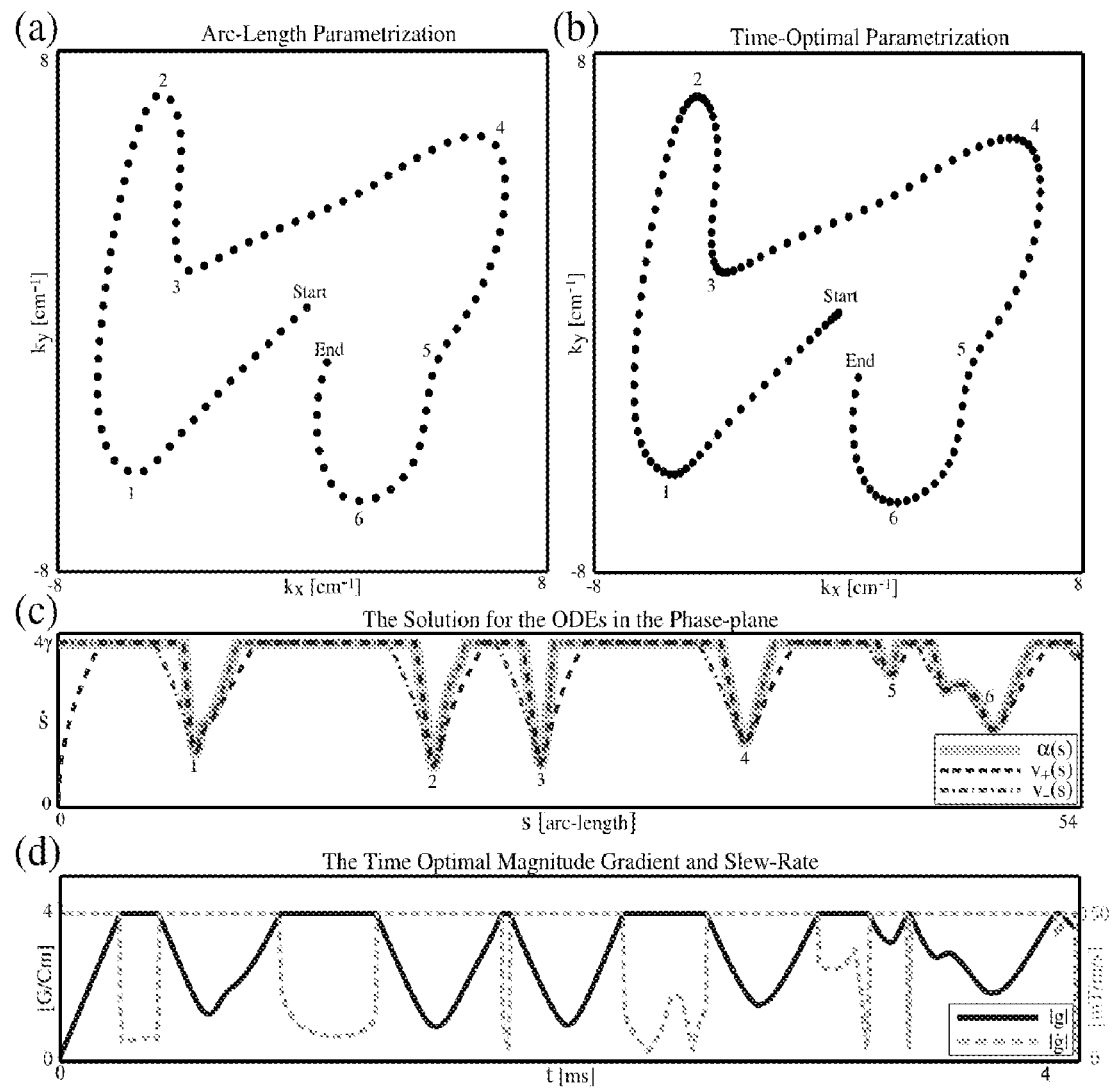
FIGS. 3a-d show the result of applying the optimization algorithm to an arbitrary trajectory.

FIGS. 3a-d show the result of applying the optimization algorithm to an arbitrary trajectory. FIG. 3a illustrates the k-space trajectory in the arc-length parameterization of the curve. FIG. 3c illustrates the constraints and the solution for the ODEs in the phase plane. The dips in the α(s) curve correspond to regions of large curvature in the trajectory. FIG. 3b illustrates the k-space trajectory in the time-optimal parameterization. It should be noted that the increased sampling density before and after turns in the trajectory. The high density corresponds to accelerations and decelerations of the gradient amplitude. FIG. 3d shows the time-optimal magnitude of the gradients and the slew rate. It should be noted that at every time point either the gradient magnitude or slew-rate is maximized, which is a necessary condition for time-optimality.

Non-Freely Rotatable Trajectories

Since the design algorithm is fast, the gradient waveform for a specific trajectory can be designed on the fly. It is possible then to redesign the gradient waveform for each scan plane such that it fully utilizes the gradient system capabilities. Specifically, that each of the gradient amplifiers and coils are independent is taken into consideration. Therefore, the total slew-rate and gradient amplitude in a diagonal k-space direction is $\sqrt{2}$ ($\sqrt{3}$ in 3D) times larger than in either x or y. A gain of 5-10% is expected, especially for a long readout duration like single shot spiral.

Therefore, the design algorithm is applied to a single shot spiral trajectory (FOV=20 cm, res=2.5 mm) used for MRI in an axial scan plane, constraining the x-gradient and y-gradient maximum amplitudes and slew-rates separately.

Figure 4:
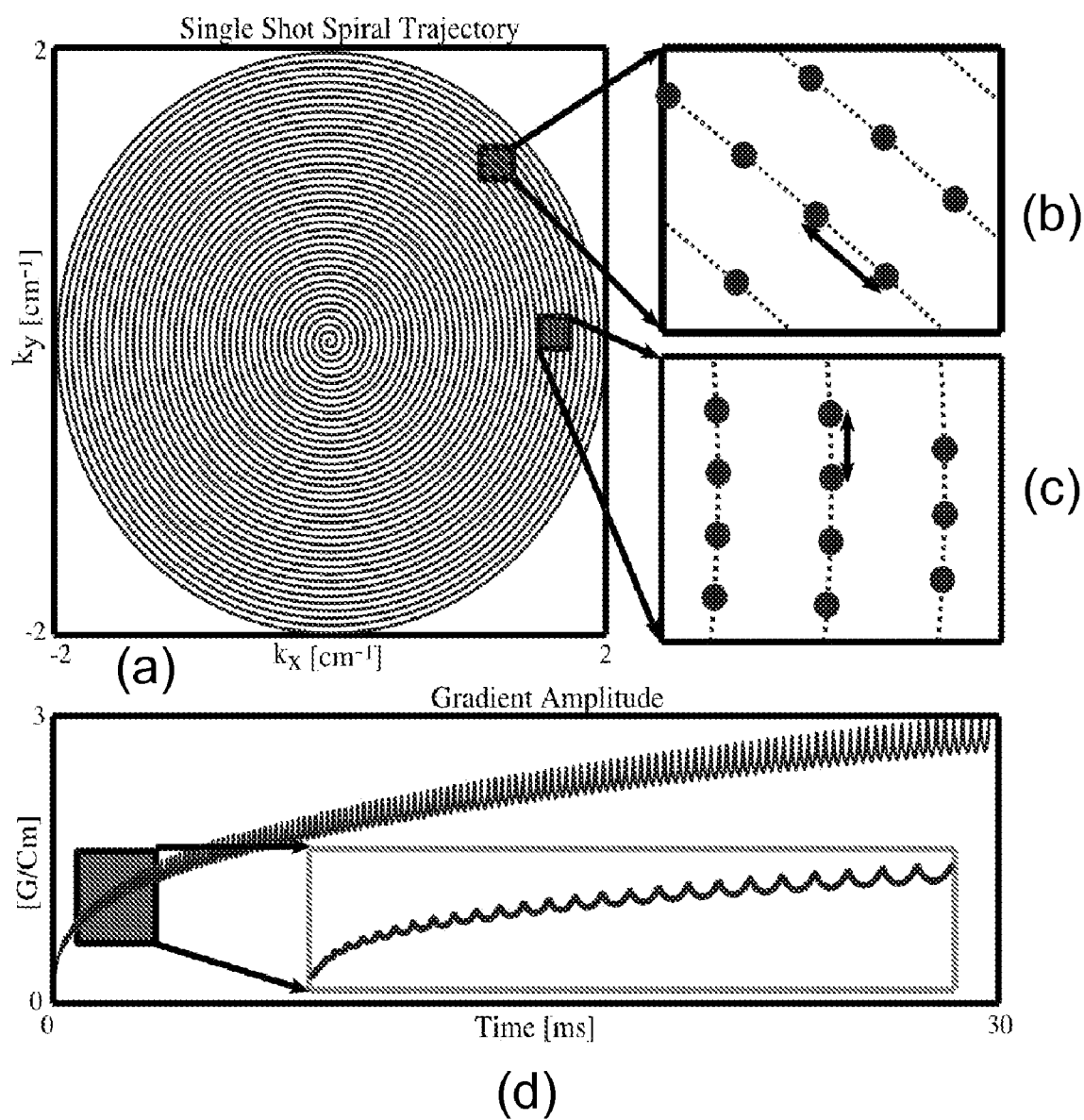
FIGS. 4a-d show a solution for a non-freely rotatable spiral trajectory.

FIGS. 4a-d show a solution for a non-freely rotatable spiral trajectory. FIGS. 4a-c illustrate the time optimal parameterization. The distance between each sample point in k-space along the diagonal direction is larger than along the horizontal and vertical directions, since both gradients are on full amplitude as opposed to only one of them. This corresponds to a larger gradient magnitude as seen in FIG. 4d, which shows the time-optimal gradient amplitude when accounting for the scan plane orientation. The oscillations in magnitude satisfy the allowed slew rate. By exploiting the scan geometry in the design, the readout duration was reduced by 5%.

Randomized Trajectories for Compressed Sensing Application

Under-sampled randomly perturbed spiral trajectories can provide faster imaging when used with a special non-linear reconstruction. When under-sampling to save scan time, it is essential that the gradient waveforms be time-optimal. Therefore, an example of the design algorithm was applied to a randomly perturbed variable density spiral where the optimal waveform is non-trivial. A 4 interleave variable density spiral was designed and chosen to have a resolution of 1 mm and a field of view (FOV) of 20 cm at the k-space origin, that linearly decreases to 5 cm on the periphery. The spiral was perturbed in the radial direction by a randomly generated smooth waveform, as shown in FIGS. 5a-b.

Figure 5:
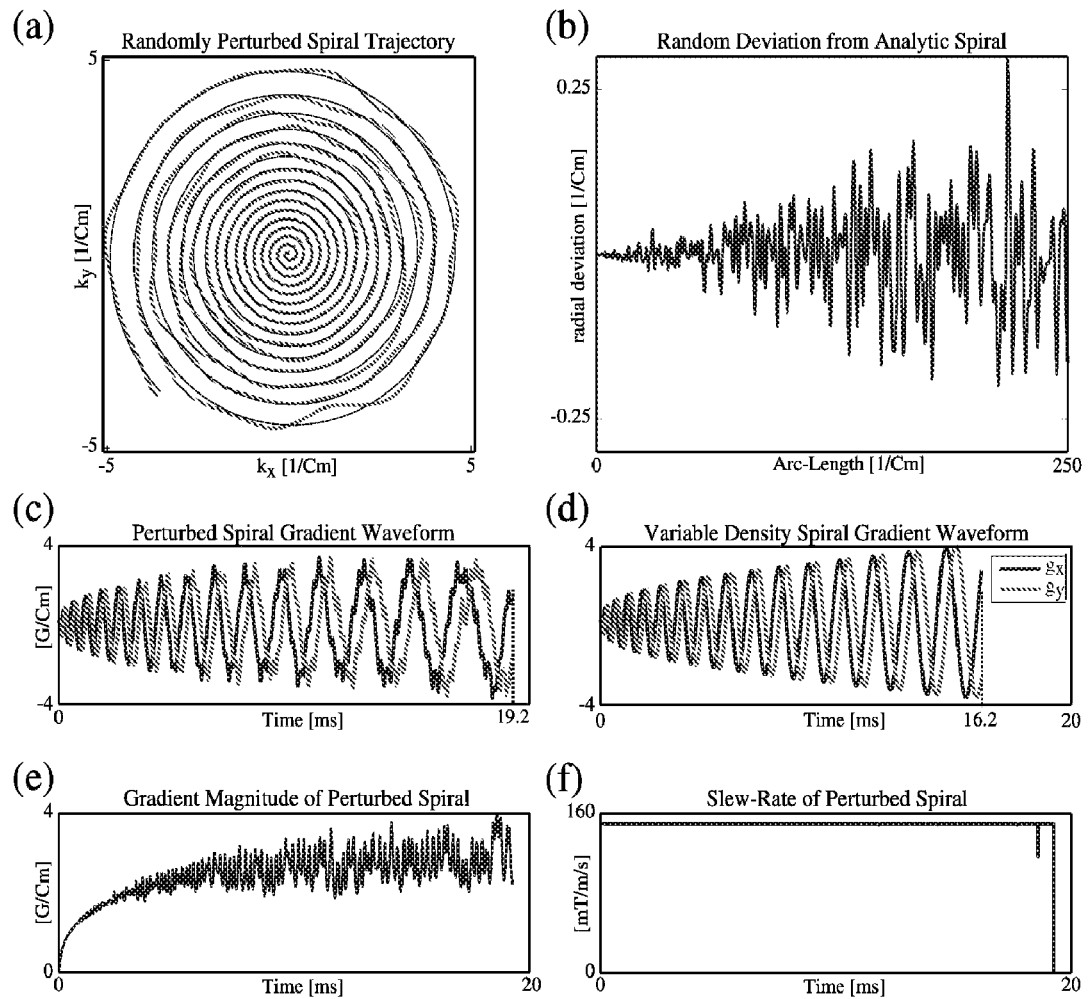
FIGS. 5a-f show the result of a randomly perturbed spiral design.

FIGS. 5a-f show the result of the randomly perturbed spiral design. The trajectory is slew-rate limited except at a single point where the gradient magnitude is maximized. The gradient waveform duration for the perturbed spiral is 18% longer than the non-perturbed. FIG. 5a shows the randomly perturbed spiral trajectory. FIG. 5b is a graph of the deviation from the analytic spiral in the radial direction vs. arc length. FIG. 5c illustrates the time-optimal gradient waveform for the perturbed spiral trajectory. FIG. 5d illustrates the variable density gradient waveform. FIG. 5e is a graph of the gradient magnitude for the perturbed spiral trajectory. FIG. 5f is a graph of the slew-rate for the perturbed spiral trajectory.

DISCUSSION AND CONCLUSIONS

An example of the invention provides a simple and non-iterative method for designing the time-optimal gradient waveforms for any k-space trajectory. It is the complete solution for the gradient waveform design when there is a k-space path constraint.

Computational Complexity

An example of the invention provides a method that is non-iterative and provides a direct time-optimal solution. The computational complexity is linear with respect to the length of the trajectory curve, and requires a solution to an ODE propagated forward and backwards in time. All operations used are simple and inexpensive both in terms of computation and memory.

Additional Constraints

To handle nonzero initial gradient g(0), it suffices to integrate the ODE (19) forward with the initial condition $v_+(0)=\gamma|g(0)|$ instead of $v+(0)=0$. However, if the value of g(0) is infeasible, the outcome of the design will be the maximum feasible one.

In the same way, to handle final gradient value g(L), it suffices to integrate the ODE (20) backward with the final condition $v_-(0)=\gamma|g(L)|$ instead of $v_-(L)=v_+(L)$. Again, if the value is infeasible, the outcome will be the maximum feasible one.

An intermediate gradient value constraint can be applied by dividing the problem into two separate designs. The first is the design of the waveform up to the intermediate point with a final value constraint. The second is the design of the waveform starting at the intermediate point with an initial value constraint.

Other constraints possible are variable maximum gradient and slew-rate that are expressed as a function of arc-length i.e., Gmax(s) and Smax(s). These can be used to enforce variable density sampling for FOV consideration, variable slew-rate constraints to minimize eddy-currents effects or orientation dependent values for non-freely rotatable trajectories.

Software

An embodiment of the invention was implemented using Matlab. Generally speeds were determined along the axis. A line diagonal to the axis may have a faster speed, since such a line forms a hypotenuse of a right triangle, where the axial directions are the legs of the triangle.

In an embodiment of the invention a general scan configuration may be specified. A computer using known hardware limitations of a specific MRI device such as slew rate and coil properties such as inhomogeneities would determine the fastest scan configuration for a specific scan plane. Such a process may make a separate configuration analysis for each different scan plane.

An embodiment of the invention also allows for the randomizing of the sampling of k-space. Such a randomization may provide a perturbation of a scanning trajectory. An example of the invention allows for providing the fastest scanning for such a trajectory with a perturbation.

Figure 6:
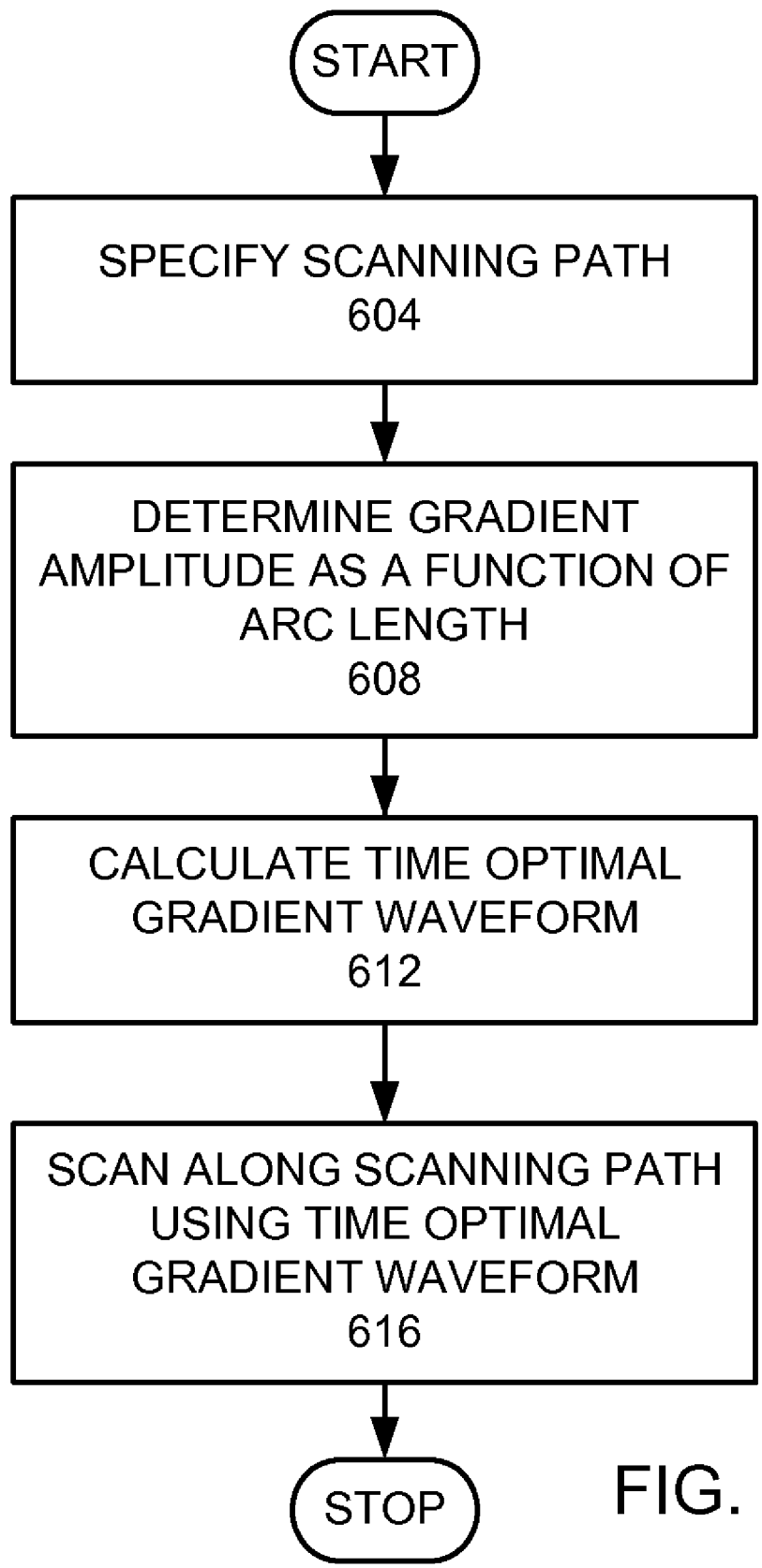
FIG. 6 is a high level flow chart of an embodiment of the invention.

FIG. 6 is a high level flow chart of an embodiment of the invention. A scanning path is specified (step 604). Gradient amplitude is determined as a function of arc length (step 608). A time optimal gradient wave form is calculated from the gradient amplitude for scanning the scanning path (step 612). In the preferred embodiment, a time optimal gradient wave form is a gradient wave form that provides the fastest time given a gradient amplitude and gradient slew rate limit, which would be a limitation for a particular machine. A scan is performed along the scanning path using the time optimal gradient waveform (step 616).

FIG. 7 is a schematic top view of a magnetic resonance imaging (MRI) system 700 that may be used in an embodiment of the invention. The MRI system 700 comprises a magnet system 704, a patient transport table 708 connected to the magnet system, and a controller 712 controllably connected to the magnet system. In one example, a patient would lie on the patient transport table 708 and the magnet system 704 would pass around the patient. The controller 712 would control magnetic fields and radio frequency (RF) signals provided by the magnet system 704 and would receive signals from detectors in the magnet system 704.

Figure 8A:
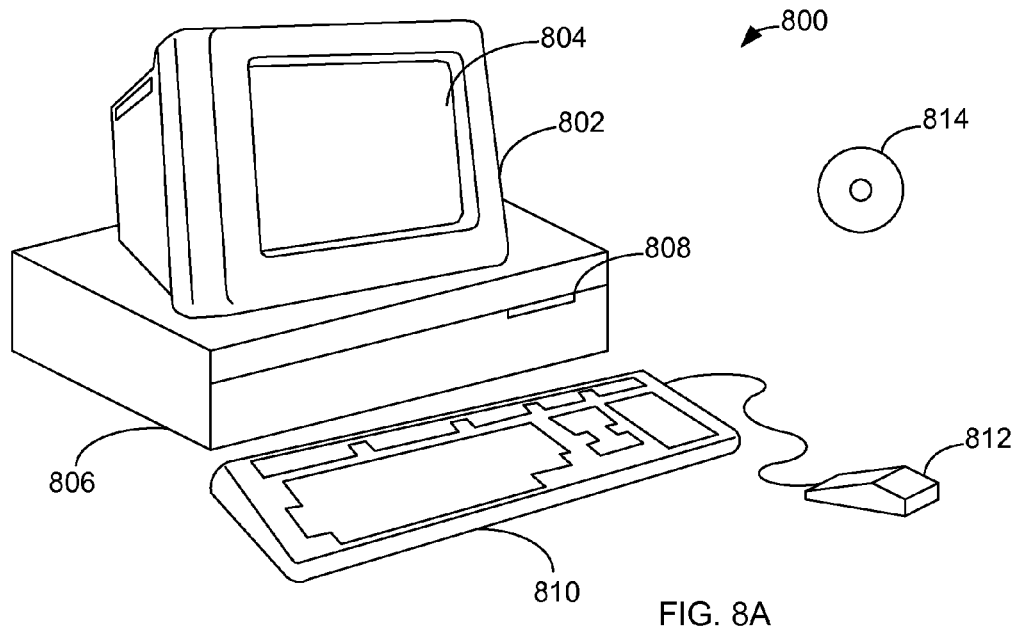
FIGS. 8A and 8B illustrate a computer system, which is suitable for implementing a controller used in embodiments of the present invention.
Figure 8B:
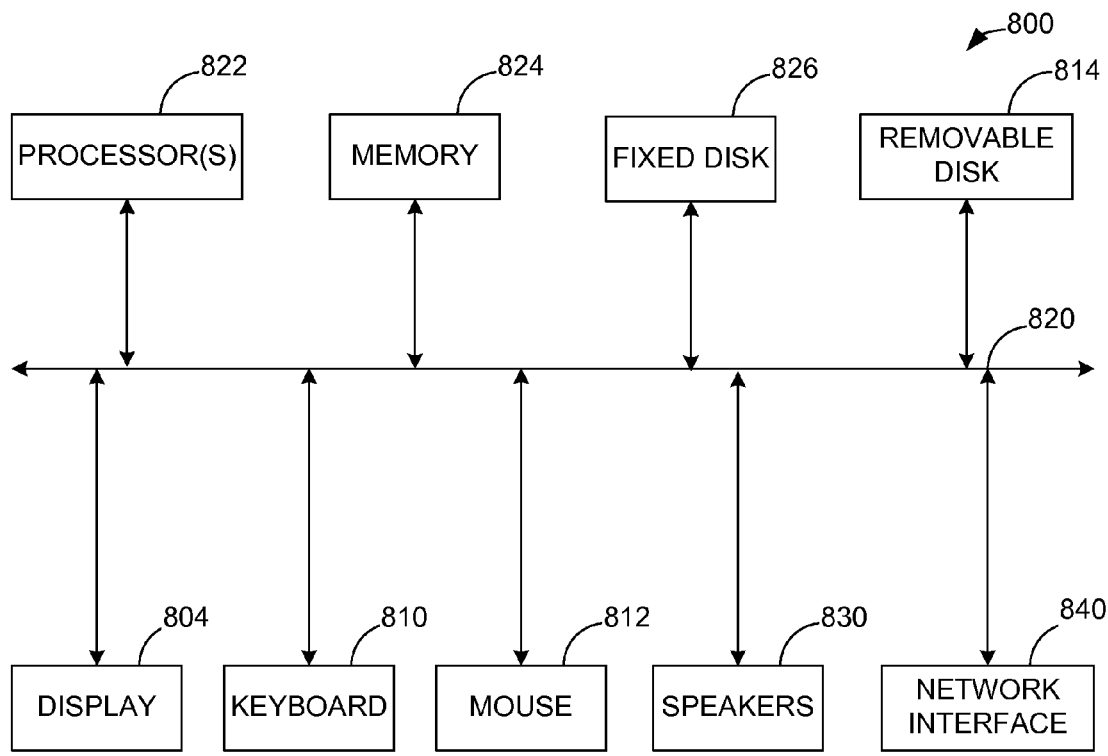

FIGS. 8A and 8B illustrate a computer system 800, which is suitable for implementing a controller 712 used in embodiments of the present invention. FIG. 8A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 8B is an example of a block diagram for computer system 800. Attached to system bus 820 are a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of the computer-readable media described below.

CPU 822 is also coupled to a variety of input/output devices, such as display 804, keyboard 810, mouse 812, and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In more specific examples of the above flow chart, the scanning along the scanning path may provide an excitation scan. In the alternative, the scanning may provide an imaging scan, which may read echo data.

Another example of the invention may be used to optimize scanning paths by specifying another scanning path, determining gradient amplitude as a function of arc-length for the another scanning path, calculating a time optimal gradient waveform for scanning the another scanning path, and comparing the time optimal gradient waveforms to determine the fastest scanning path. The determination of weak points and using weak points may also be used to determine or specify a faster scanning path.

Another example of the invention calculates optimal gradient waveforms on the fly, where for a first scanning plane a first scanning path is specified, gradient amplitude is determined as a function of arc-length, a time optimal gradient waveform for scanning the scanning path is calculated and scanning is done along the first scanning path using the time optimal gradient waveform. For a second scanning plane a second scanning path is specified, a second scanning path is defined for the second scanning plane, which is different from the first scanning plane.

To obtain optimal time scans either speed or acceleration is maximized. For a straight path, acceleration is maximized until maximum velocity is reached. When a curve is approached the speed must be reduced to the maximum speed for the curve. The slew rate determines the maximum acceleration. The maximum gradient determines the maximum speed.

In an example of the invention, the trajectory is traversed in equi-space distances to determine the limits for acceleration a(s). So traversing in the first direction provides a maximum acceleration until a curve or the maximum velocity is reached, then the maximum velocity for the curve is used through the curve. The resulting velocities and accelerations may still violate the conditions. Therefore the trajectory is traversed from the end to the beginning to determine the maximum velocity and maximum acceleration. The minimum of the maximum velocity and maximum acceleration from the two traversals in each direction is then used.

Because the solution for calculating a time optimal gradient waveform for scanning the scanning path from the gradient amplitude uses an algorithm that can be used for the generalized trajectories, the solution is a general solution. Such a general solution is able to provide a general case solution for arbitrary trajectories, which include trajectories with random perturbations and trajectories that have non-traditional trajectories.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for magnetic resonance imaging (MRI) comprising the steps of:
    a) specifying a scanning path;
    b) determining gradient amplitude directly as a function of arc-length along the specified scanning path in k-space, rather than as a function of time;
    c) calculating a time optimal gradient waveform for scanning the scanning path from the gradient amplitude; and
    d) scanning along the scanning path using the time optimal gradient waveform.

2. The method of claim 1, wherein the scanning is an excitation scanning path.

3. The method of claim 1, wherein the scanning is an imaging scanning path, further comprising generating an MRI image.

4. The method of claim 3, further comprising:
    specifying another scanning path;
    determining gradient amplitude as a function of arc-length for the another scanning path;
    calculating a time optimal gradient waveform for the scanning of the another scanning path; and
    comparing the time optimal gradient waveforms.

5. The method of claim 4 further comprising:
    determining weak points; and
    using the weak points to specify a faster scanning path.

6. The method of claim 3, wherein the scanning path is for a first scanning plane, further comprising:
    specifying a second scanning path different from the scanning path for a second scanning plane different from the first scanning plane;
    designing a gradient amplitude as a function of arc-length along the second scanning path in k-space;
    calculating a time optimal gradient waveform for scanning the second scanning path; and
    scanning along the second scanning path using the time optimal gradient waveform.

7. The method of claim 3 wherein in step c) comprises:
    traversing the specified scanning path in a first direction to determine maximum velocities and accelerations for individual points along the scanning path;
    traversing the specified scanning path in a second direction opposite to the first direction and determine maximum velocities and accelerations for the individual points along the scanning path;
    calculating the time optimal gradient waveform from the minimum of the maximum velocities and accelerations for each of the individual points along the scanning path found by traversing the specified scanning path in the first direction and the second direction.

8. The method of claim 1 further comprising determining a gradient waveform as a function of time.

9. The method of claim 1 wherein in step c) a solution is found for arbitrary paths.

10. The method of claim 1, wherein the time optimal gradient waveform maximizes the gradient magnitude or the slew-rate at every time point.

11. The method of claim 1, wherein the time optimal gradient waveform provides a larger spacing of sampling points in k-space in a diagonal direction than along horizontal and vertical directions.

12. The method of claim 1, wherein the scanning path has a random perturbation.

13. The method of claim 1, further comprising:
    specifying another scanning path;
    determining gradient amplitude as a function of arc-length for the another scanning path;

calculating a time optimal gradient waveform for the scanning of the another scanning path; and comparing the time optimal gradient waveforms.

14. The method of claim 13 further comprising:

determining weak points; and using the weak points to specify a faster scanning path.

15. The method of claim 1, wherein the scanning path is for a first scanning plane, further comprising:

specifying a second scanning path different from the scanning path for a second scanning plane different from the first scanning plane;

designing a gradient amplitude as a function of arc-length along the second scanning path in k-space;

calculating a time optimal gradient waveform for scanning the second scanning path; and scanning along the second scanning path using the time optimal gradient waveform.

16. The method of claim 1 wherein in step c) comprises:

traversing the specified scanning path in a first direction to determine maximum velocities and accelerations for individual points along the scanning path;

traversing the specified scanning path in a second direction opposite to the first direction and determine maximum velocities and accelerations for the individual points along the scanning path;

calculating the time optimal gradient waveform from the minimum of the maximum velocities and accelerations for each of the individual points along the scanning path found by traversing the specified scanning path in the first direction and the second direction.

17. A magnetic resonance imaging apparatus, comprising:

a magnetic resonance imaging excitation and detection system; and a controller electrically connected to the magnetic resonance imaging excitation and detection system, comprising:

a display;

at least one processor; and computer readable media, comprising:

computer readable code configured for specifying a scanning path;

computer readable code configured for directly determining gradient amplitude as a function of arc-length along the specified scanning path in k-space, rather than as a function of time;

computer readable code configured for calculating a time optimal gradient waveform that scans the specified scanning path based on the directly determined gradient amplitude as a function of arc-length along the specified scanning path in k-space, rather than as a function of time; and computer readable code configured for scanning along the scanning path using the time optimal gradient waveform.

18. The apparatus of claim 17, wherein the scanning is an excitation scanning path.

19. The apparatus of claim 18, wherein the scanning is an imaging scanning path, further comprising:

generating an MRI image; and displaying the MRI image on the display.

* * * * *

UNITED STATES PATENT AND TRADEMARK OFFICE
CERTIFICATE OF CORRECTION

| | | |
|---|---|---|
| PATENT NO. | : 7,791,338 B2 | Page 1 of 1 |
| APPLICATION NO. | : 11/852198 | |
| DATED | : September 7, 2010 | |
| INVENTOR(S) | : Kim et al. | |

It is certified that error appears in the above-identified patent and that said Letters Patent is hereby corrected as shown below:

In the Specification Under Column 1:

• Please replace Column 1, line no. 6-11 with:

-- FEDERALLY-SPONSORED RESEARCH OR DEVELOPMENT
This invention was made with Government support under contracts HL074332, HL067161, and EB002992 awarded by the National Institutes of Health. The Government has certain rights in this invention. --

Signed and Sealed this
Twentieth Day of March, 2012

David J. Kappos
*Director of the United States Patent and Trademark Office*